United States Patent
Kwon et al.

(10) Patent No.: US 7,471,147 B2
(45) Date of Patent: Dec. 30, 2008

(54) AUTOMATIC GAIN CONTROLLER

(75) Inventors: Dae-hoon Kwon, Seoul (KR);
Jeong-won Lee, Seongnam-si (KR)

(73) Assignee: Samsung Electronics Co., Ltd.,
Suwon-si (KR)

( * ) Notice: Subject to any disclaimer, the term of this patent is extended or adjusted under 35 U.S.C. 154(b) by 186 days.

(21) Appl. No.: 11/403,905

(22) Filed: Apr. 14, 2006

(65) Prior Publication Data

US 2007/0040610 A1 Feb. 22, 2007

(30) Foreign Application Priority Data

Aug. 22, 2005 (KR) .............. 10-2005-0076855

(51) Int. Cl.
*H03G 3/20* (2006.01)
*H03F 3/45* (2006.01)
(52) U.S. Cl. ........................ 330/140; 330/254
(58) Field of Classification Search ............ 330/140, 330/254, 253, 259, 255, 264, 127; 327/540
See application file for complete search history.

(56) References Cited

U.S. PATENT DOCUMENTS 7,215,191 B2 * 5/2007 Maejima ................. 330/10
2002/0008581 A1 * 1/2002 Callahan Jr. .............. 330/254
2005/0264347 A1 * 12/2005 Gyohten et al. ........... 327/540

* cited by examiner

*Primary Examiner*—Robert Pascal
*Assistant Examiner*—Khiem D Nguyen
(74) *Attorney, Agent, or Firm*—Sughrue Mion, PLLC

(57) ABSTRACT

An automatic gain controller includes a variable gain amplifier for amplifying an input signal having a specified DC level on the basis of the DC level, and outputting a first differential signal having a specified gain α, a second differential signal having a 180° phase difference from the first differential signal, and an output signal obtained by subtracting the second differential signal from the first differential signal; a full-wave-rectifying unit for full-wave-rectifying the first differential signal and the second differential signal; a low-pass filter for extracting the DC component from the output signal of the full-wave-rectifying unit and outputting the extracted DC component; a reference voltage level adjustment unit for adjusting a DC level of a reference voltage; and a comparison unit for comparing the output signal of the low-pass filter with the output signal of the reference voltage level adjustment unit to adjust a gain of the variable gain amplifier.

8 Claims, 14 Drawing Sheets

A+D

B+C (A+D)−(B+C)

N=50ea(PRIOR ART,AGCO1)

N=50ea(PRIOR ART,AGCO2)

N=50ea(PRESENT INVENTION,AGCO1)

N=50ea(PRESENT INVENTION,AGCO2)

N=50ea(PRIOR ART,AGC01/AGC01 Ratio)

N=50ea(PRESENT INVENTION,AGC01/AGC02 Ratio)

AUTOMATIC GAIN CONTROLLER

This application claims priority from Korean Patent Application No. 2005-76855, filed on Aug. 22, 2005, the entire content of which is incorporated herein by reference.

BACKGROUND OF THE INVENTION

1. Field of the Invention

The invention relates to an automatic gain controller. More particularly, the present invention relates to an automatic gain controller that receives an input signal and can output an output signal with the amplitude maintained constant, without using an operational amplifier for shifting the direct current (DC) level of the output signal.

2. Description of the Related Art

An optical disk may be classified into a write-once disk such as a CD-ROM and a DVD-ROM, and a rewritable disk such as a CD-RW, a DVD-RW, and a DVD-RAM. The rewritable disk cannot generate a clock signal from a reproduced signal, unlike an existing read-only disk. Accordingly, grooves of the disk on which information is recorded are wobbled for a predetermined period, and a clock signal required for a recording operation is generated by detecting this wobble signal.

FIG. 1 is a block diagram of a conventional wobble signal reproducing apparatus, and FIGS. 2A-C are views illustrating a wobble signal reproducing process performed by the apparatus of FIG. 1.

As shown in FIG. 1, wobble signals are measured at regions A, B, C and D on a disk 10. Quantities of light corresponding to the wobble signals measured at the regions A and D are added together by an adder 20a, and quantities of light corresponding to the wobble signals measured at the regions B and C are added together by an adder 20b. A signal A+D outputted from the adder 20a and a signal B+C outputted from the adder 20b have RF signals having the same phase and wobbling signals having a phase difference of 180° with each other as shown in FIGS. 2A and 2B. The signal A+D and the signal B+C are filtered by high-pass filters (HPF) 30a and 30b having a cutoff frequency enough to pass the wobble signals, respectively, and thus DC offsets thereof are eliminated.

Then, by performing the operation of (A+D)−(B+C), the RF signal that is the in-phase component is eliminated, and the wobble signal that is the inverse-phase component is extracted. Since the amplitude of the RF signal contained in the signals A+D and B+C is varied due to the sensitivity imbalance of a photo detector and mismatching of each channel, it is required to compensate for the varied amplitude of the RF signal. Accordingly, automatic gain controllers (AGC) 40a and 40b compensate for the amplitude of the RF signal constantly, in order to prevent leakage of the RF signal due to the wobble signal.

A subtracter 50 subtracts the signal B+C from the signal A+D, which are gain-adjusted by the automatic gain controllers 40a and 40b, to output the wobble signal as shown in FIG. 2C. A band-pass filter (BPF) 60 having a narrow band detects a wobble signal having a high signal-to-noise ratio (S/N) from the output wobble signal, and after the automatic gain controller (AGC) 70 amplifies the gain of the wobble signal, a comparator 80 quantizes the wobble signal and outputs a wobble clock signal.

The construction of the automatic gain controller capable of consistently compensating for and outputting the amplitude of a desired input signal will now be described.

FIG. 3 is a view illustrating the construction of a conventional automatic gain controller, and FIGS. 4A through 4B are views illustrating waveforms of the signal from each terminal of the automatic gain controller shown in FIG. 3.

Referring to FIG. 3, an automatic gain controller 40a includes a variable gain amplifier (VGA) 41, a high-pass filter (HPF) 42, a signal level detection unit 43, and a comparison unit 44.

The variable gain amplifier 41 amplifies an input signal Vin with a predetermined amplification gain a according to a control voltage $V_{control}$ input from the comparison unit 44, and outputs a first differential signal Vp', a second differential signal Vn' having a 180° phase difference from the first differential signal Vp', and an output signal Vout obtained by subtracting the second differential signal Vn' from the first differential signal Vp'. Here, the gain α is increased in proportion to the control voltage $V_{control}$, and the input signal Vin has a voltage Vref as a DC level.

The high-pass filter (HPF) 42 shifts DC levels of the first differential signal Vp' and the second differential signal Vn' to the DC level Vref of the input signal Vin to output the DC-level-shifted differential signals.

The signal level detection unit 43 full-wave-rectifies first and second differential signals Vp and Vn, and extracts a DC component from the full-wave-rectified signal Vfr to output the extracted DC component. More specifically, the signal level detection unit 43 includes a full-wave rectifier 43-1 and a low-pass filter 43-2.

The full-wave rectifier 43-1 full-wave-rectifies the first differential signal Vp and the second differential signal Vn which are output from the high-pass filter 42. The low-pass filter 43-2 extracts the DC component from the signal Vfr full-wave-rectified by the full-wave rectifier 43-1.

The magnitude of the output voltage V_lpf of the low-pass filter 43-2 will now be described with reference to FIGS. 4A through 4F. When the input signal Vin, of which the magnitude of the peak-peak voltage is A (FIG. 4A), is input to the variable gain amplifier 41, the magnitude of the peak-to-peak voltage of the output signal Vout becomes 2αA (FIG. 4B), and the magnitude of the peak-to-peak voltage of the first differential signal Vp (FIG. 4C) and the second differential signal Vn becomes αA (FIG. 4D). The magnitude of the DC component of the full-wave-rectified signal Vfr (FIG. 4E) becomes a value obtained by adding the DC level Vref to a value $\alpha A/\sqrt{2}$ which is obtained by adding an effective value $\alpha A/2\sqrt{2}$ of an AC component of the first differential signal Vp to an effective value $\alpha A/2\sqrt{2}$ of an AC component of the second differential signal Vn. That is, the magnitude of the DC component of the full-wave-rectified signal Vfr becomes Vref+ $(\alpha A/\sqrt{2})$, which is equal to the magnitude of the output voltage V_lpf of the low-pass filter 43-2, as shown in FIG. 4F. The reference voltage Vref added to the effective value $\alpha A/\sqrt{2}$ of the AC component of the output signal Vout makes Vref+$(\alpha A/\sqrt{2})$, which is equal to the magnitude of the DC component of the full-wave-rectified signal Vfr.

The comparison unit 44 receives the output voltage V_lpf of the low-pass filter 43-2 and a reference voltage V_level and compares them with each other. If the output voltage V_lpf of the low-pass filter 43-2 is lower than the reference voltage V_level, the comparison unit 44 increases the gain of the variable gain amplifier 41 by heightening the control voltage Vcontrol. Thus, the peak-peak voltage of the output signal Vout is increased.

By contrast, if the output voltage V_lpf of the low-pass filter 43-2 is higher than the reference voltage V_level, the comparison unit 44 decreases the gain of the variable gain amplifier 41 by lowering the control voltage Vcontrol. Thus, the peak-to-peak voltage of the output signal Vout is decreased. If the output voltage V_lpf of the low-pass filter 43-2 reaches the reference voltage V_level, the output signal Vout is output with a constant magnitude of the peak-peak voltage.

In order to output the peak-to-peak voltage of the output signal Vout as Vpp, the comparison unit 44 controls the reference voltage V-level to have a magnitude of $Vref+(Vpp/2\sqrt{2})$. Here, $Vpp/2\sqrt{2}$ is an effective value of a target peak-peak voltage Vpp of the output signal Vout.

FIG. 5 is a view illustrating the detailed construction of a signal level detection unit in FIG. 3. FIGS. 6A through 6E are views illustrating signal waveforms appearing at respective points of the signal level detection unit in FIG. 3.

Referring to FIGS. 5 and 6A through 6E, the signal level detection unit 43 includes the full-wave rectifier 43-1 composed of first through third transistors $Q_{n1}$, $Q_{n2}$, and $Q_{n3}$ and an operational amplifier OP-Amp, and the low-pass filter 43-2 composed of a resistor R and a capacitor C.

The pair of the first and second transistors $Q_{n1}$ and $Q_{n2}$ full-wave-rectify the first and second differential signals Vp (FIG. 6B) and Vn (FIG. 6A). The DC level Vref' of the signal $V_A$ (FIG. 6C) outputted from the first and second transistors $Q_{n1}$ and $Q_{n2}$ is lowered as much as the DC voltage $V_{GS}$ between the gates and sources of the first and second transistors $Q_{n1}$ and $Q_{n2}$ from the reference voltage Vref. Here, $Vref'=Vref-V_{GS}$. The operational amplifier OP-Amp and the third transistor $Q_{n3}$ increase the DC level of the full-wave-rectified signal $V_A$ as mush as $V_{GS}$. Accordingly, the DC level of the signal $V_B$ (FIG. 6D) inputted to the low-pass filter 43-2 becomes again Vref, and finally the signal V_lpf (FIG. 6E) outputted from the low-pass filter 43-2 becomes Vref.

The conventional automatic gain controller employs the operational amplifier OP-Amp in order to shift the DC level of the full-wave-rectified signal VA to Vref. However, random offset voltages exist in the operational amplifier due to the mismatching of a manufacturing process. In fact, there is a problem in that the offset voltage is generally in the range of several tens of mV.

Accordingly, supposing that the offset voltage of the operational amplifier used in the conventional automatic gain controller is 50 mV, an error of the peak-peak voltage of the output signal from the automatic gain controller leads to about 140 mV, which lowers the precision remarkably. Also, since the random offset voltage of the operational amplifier has a different value for every chip, varied imprecision among different chips results.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

An aspect of the present invention is to provide an automatic gain controller that receives an input signal and can output an output signal with the amplitude maintained constant, without using an operational amplifier for shifting the DC level of the output signal.

An aspect of the present invention provides an automatic gain controller which comprises a variable gain amplifier for amplifying an input signal having a specified DC level on the basis of the DC level, and outputting a first differential signal having a specified gain α, a second differential signal having a 180° phase difference from the first differential signal, and an output signal obtained by subtracting the second differential signal from the first differential signal; a full-wave-rectifying unit for receiving and full-wave-rectifying the first differential signal and the second differential signal; a low-pass filter for extracting the DC component from the output signal of the full-wave-rectifying unit and outputting the extracted DC component; a reference voltage level adjustment unit for receiving a desired reference voltage and adjusting a DC level of the reference voltage as much as a variation of the DC level produced when the first differential signal and the second differential signal are full-wave-rectified; and a comparison unit for comparing the output signal of the low-pass filter with the output signal of the reference voltage level adjustment unit to adjust a gain of the variable gain amplifier.

If the output signal of the low-pass filter is higher than the output signal of the reference voltage level adjustment unit, the comparison unit may decrease the gain of the variable gain amplifier, and if the output signal of the low-pass filter is lower than the output signal of the reference voltage level adjustment unit, the comparison unit may increase the gain of the variable gain amplifier.

The reference voltage may have a magnitude obtained by adding an effective value of a target peak-to-peak voltage of the output signal to the DC level.

The full-wave-rectifying unit may include a first transistor for half-wave-rectifying the first differential signal received through its gate, and outputting the half-wave-rectified first differential signal to its source; and a second transistor for half-wave-rectifying the second differential signal received through its gate, and outputting the half-wave-rectified second differential signal to its source, wherein a connection point of the source of the first transistor and the source of the second transistor is connected to an input terminal of the low-pass filter.

The reference voltage level adjustment unit may include a third transistor for lowering the DC level of the reference voltage received through its gate as much as the variation of the DC level, and outputting the reference voltage with its DC level lowered to its source.

The first through third transistors may be N-type metal-oxide-semiconductor (NMOS) transistors.

The first through third transistors may have the same characteristic, and be driven by a bias current having the same magnitude.

The automatic gain controller may further comprise a high-pass filter for level-shifting the first and second differential signals output from the variable gain amplifier so that the first and second differential signals have the same DC level, and outputting the DC-level-shifted first and second differential signals to the full-wave-rectifying unit.

BRIEF DESCRIPTION OF THE DRAWINGS

The above and/or other aspects of the present invention will become more apparent by describing certain exemplary embodiments of the present invention with reference to the accompanying drawings, in which.

DETAILED DESCRIPTION OF THE EXEMPLARY EMBODIMENTS

Figure 1:
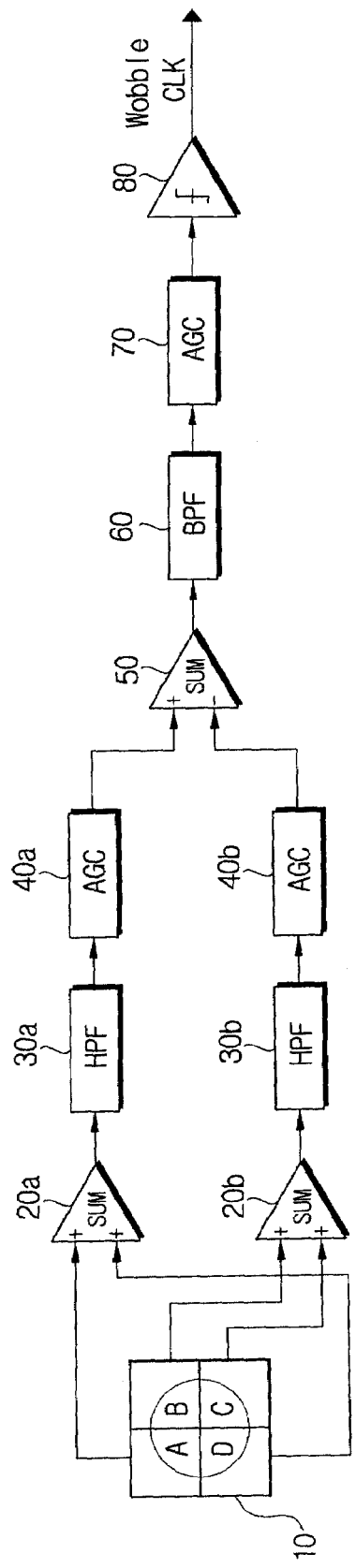
FIG. 1 is a block diagram of a conventional wobble signal reproducing apparatus.
Figure 2A:
FIGS. 2A through 2C are views illustrating a wobble signal reproducing process performed by the apparatus as shown in FIG. 1.
Figure 2B:
Figure 2C:

Certain exemplary embodiments of the present invention will be described in greater detail with reference to the accompanying drawings.

In the following description, same drawing reference numerals are used for the same elements even in different drawings. The matters defined herein are described at a high-level of abstraction to provide a comprehensive yet clear understanding of the invention. It is also to be noted that it will be apparent to those ordinarily skilled in the art that the present invention is not limited to the description of the exemplary embodiments provided herein.

Figure 7:
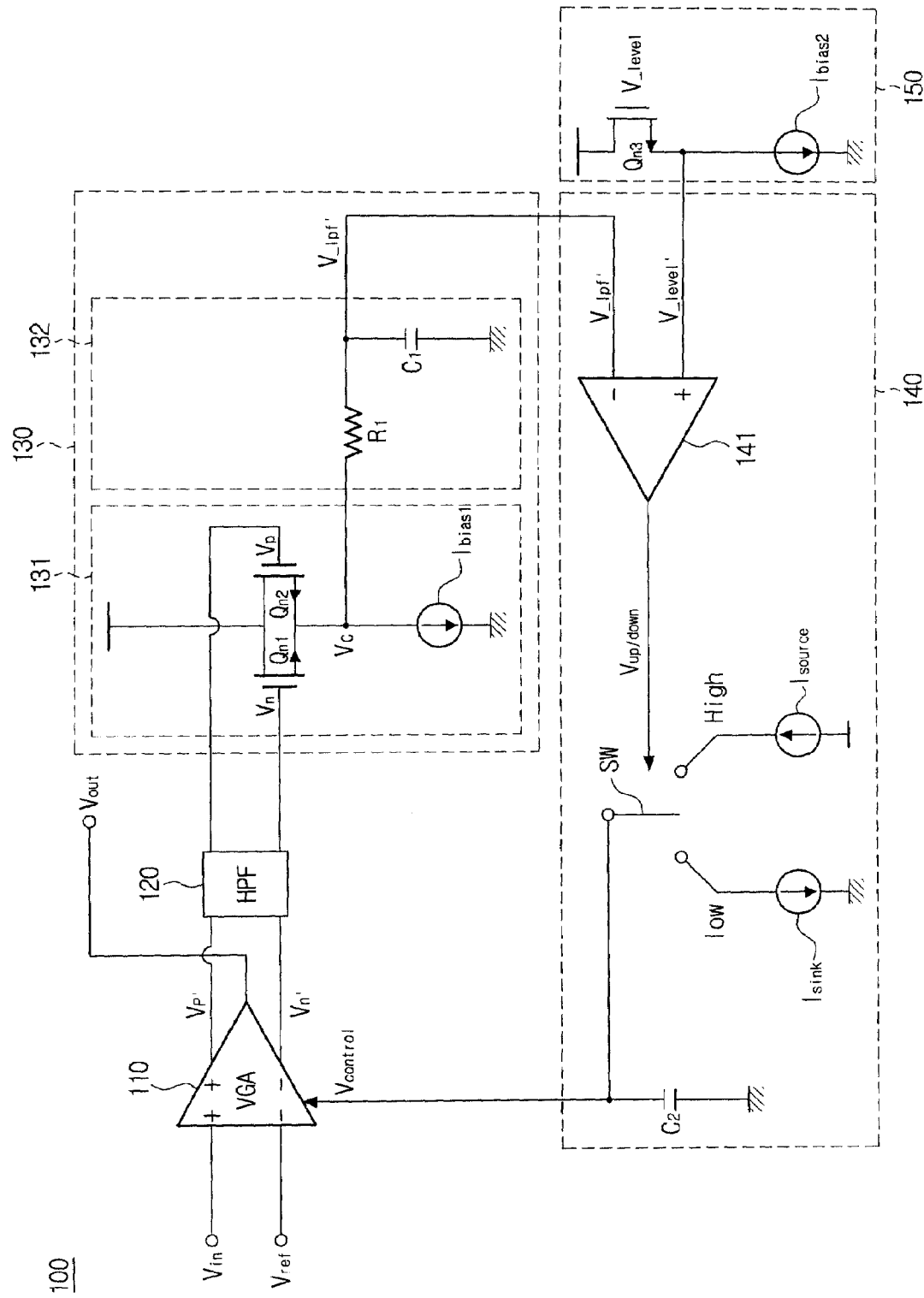
FIG. 7 is a circuit diagram of an automatic gain controller according to an exemplary embodiment of the present invention.
Figure 8A:
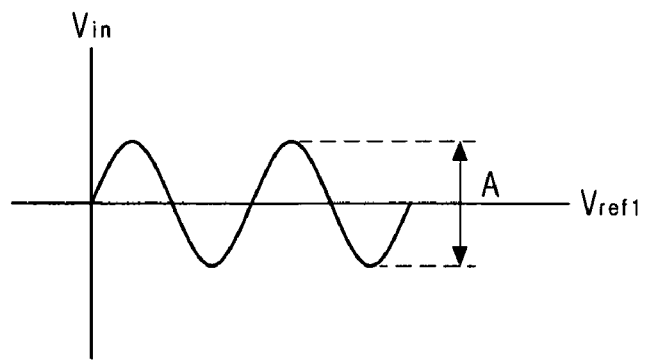
FIGS. 8A through 8G are views illustrating signal waveforms appearing at respective points of the automatic gain controller of FIG. 7.
Figure 8B:
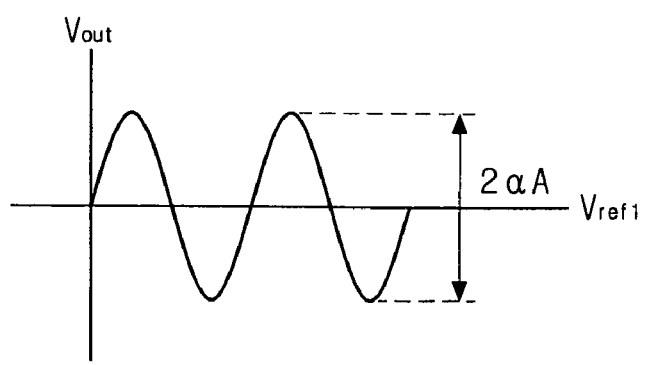
Figure 8C:
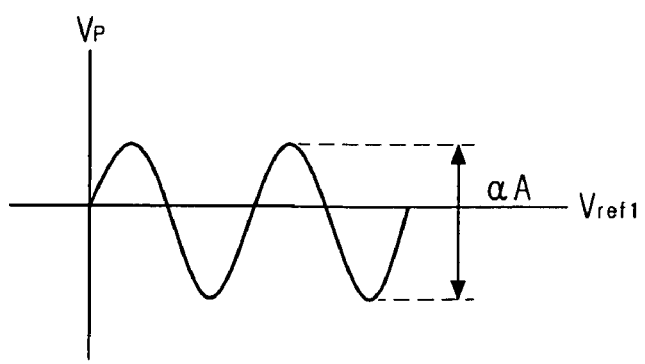
Figure 8D:
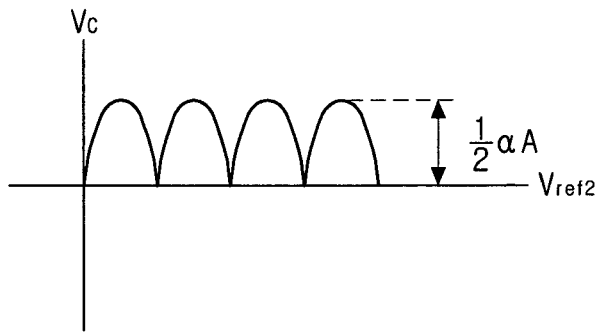
Figure 8E:
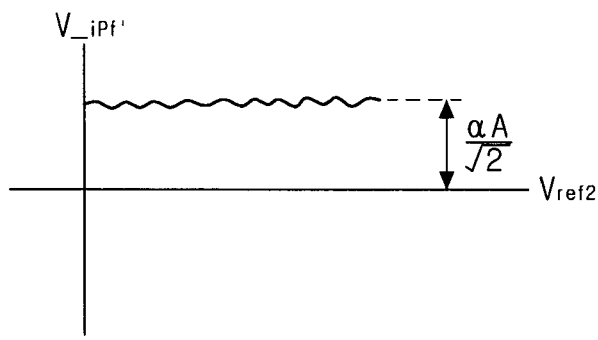
Figure 8F:
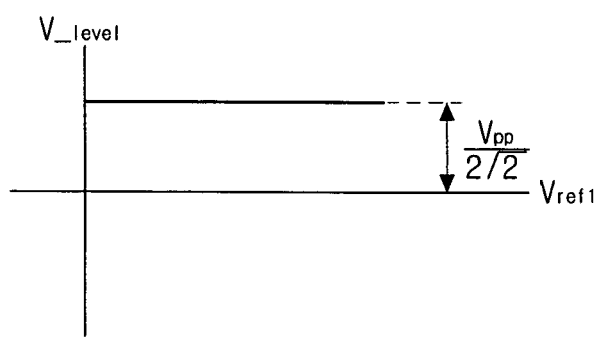
Figure 8G:
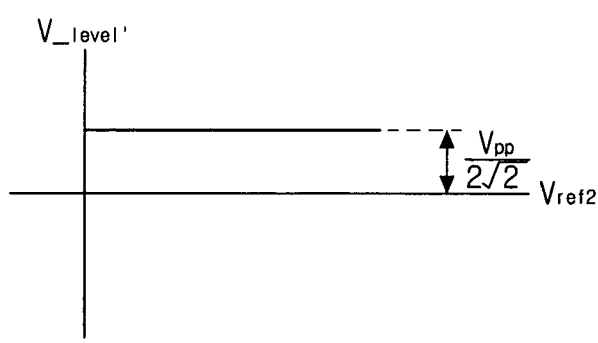

FIG. 7 is a circuit diagram of an automatic gain controller according to an exemplary embodiment of the present invention. FIGS. 8A through 8G are views illustrating signal waveforms appearing at respective points of the automatic gain controller, as shown in FIG. 7.

Referring to FIG. 7, an automatic gain controller 100 according to the present invention includes a variable gain amplifier (VGA) 110, a high-pass filter (HPF) 120, a level detection unit 130, and a comparison unit 140.

The variable gain amplifier 110 amplifies an input signal Vin having Vref1 as a DC level according to a magnitude of a control voltage Vcontrol, and outputs a first differential signal Vp' having a desired gain α, a second differential signal Vn' having a 180° phase difference from the first differential signal Vp', and an output signal Vout obtained by subtracting the second differential signal Vn' from the first differential signal Vp'. The gain α is increased in proportion to the magnitude of the control voltage Vcontrol.

The high-pass filter (HPF) 120 level-shifts a reference voltage of the first differential signal Vp' and the second differential signal Vn' to the DC level Vref1 of the input signal Vin.

The level detection unit 130 full-wave-rectifies a first differential signal Vp and a second differential signal Vn, and extracts a DC component from the full-wave-rectified signal Vc. Specifically, the level detection unit 130 includes a full-wave rectifier 131 and a low-pass filter 132.

The full-wave rectifier 131 includes a pair of first and second NMOS transistors (N-type metal-oxide semiconductor field-effect transistor) $Q_{n1}$ and $Q_{n2}$ for full-wave-rectifying the first differential signal Vp and the second differential signal Vn which are output from the high-pass filter 120. The drain and source of the first NMOS transistor $Q_{n1}$ are connected to the drain and source of the second NMOS transistor $Q_{n2}$, respectively. The first and second NMOS transistors $Q_{n1}$ and $Q_{n2}$ receive the first differential signal Vp and the second differential signal Vn through their gates, and half-wave-rectify the first differential signal and the second differential signal, respectively. The half-wave-rectified signals are synthesized at a connection point of the source of the first NMOS transistor $Q_{n1}$ and the source of the second NMOS transistor $Q_{n2}$, and the synthesized signal is input to the low-pass filter 132.

As described above, the DC level Vref2 of the signal Vc full-wave-rectified by the full-wave rectifier 131 is lowered as much as the DC voltage $V_{GS}$ between the gates and the sources of the first and second NMOS transistor $Q_{n1}$ and $Q_{n2}$ compared to the DC level Vref1 of the first and second differential signals Vp and Vn. In the present exemplary embodiment, the DC level of the full-wave-rectified signal Vc is directly input to the low-pass filter 132, without performing the level shift from Vref2 to Vref1 through the operational amplifier.

Figure 3:
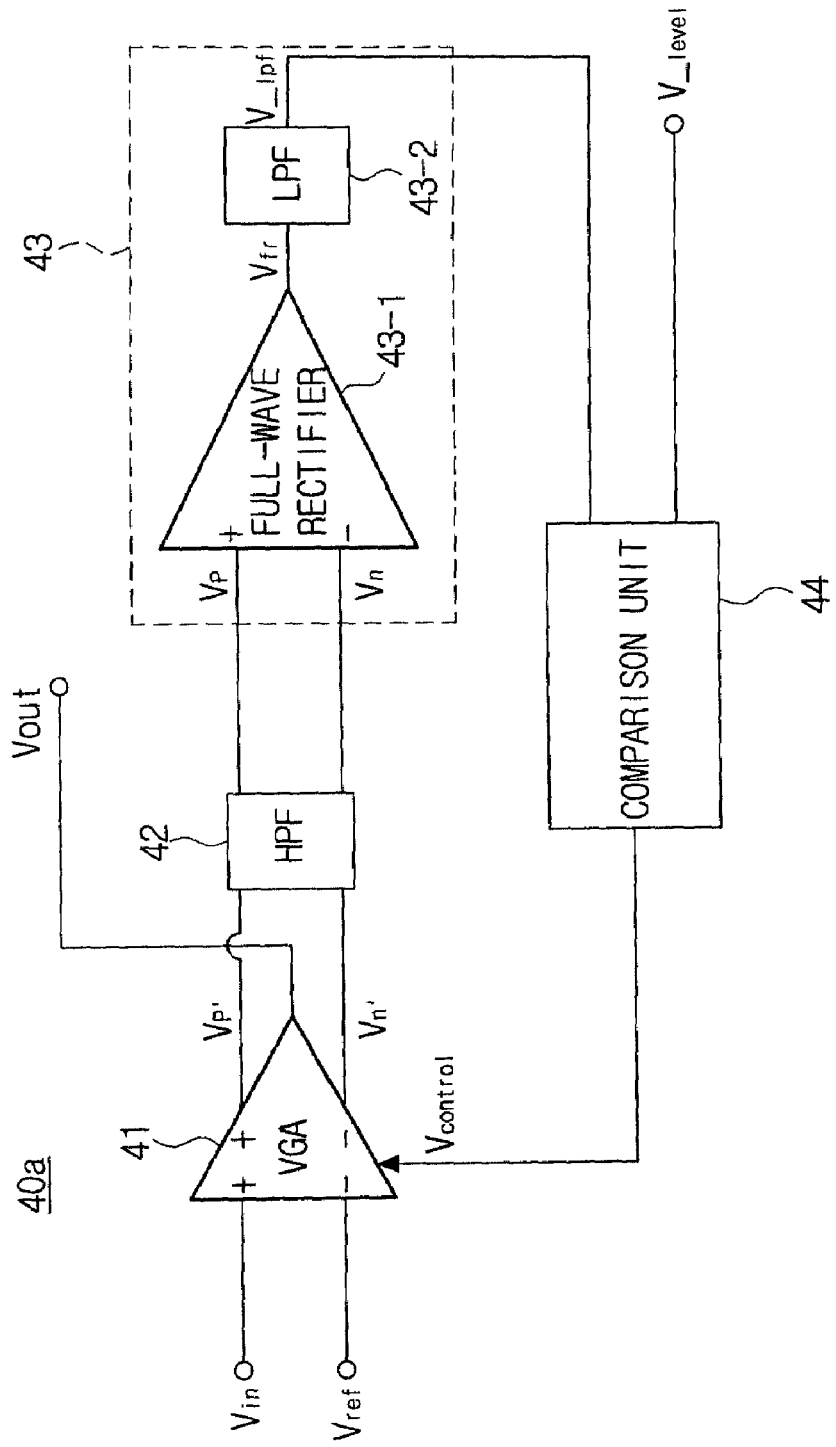
FIG. 3 is a diagram illustrating the construction of a conventional automatic gain controller.
Figure 4A:
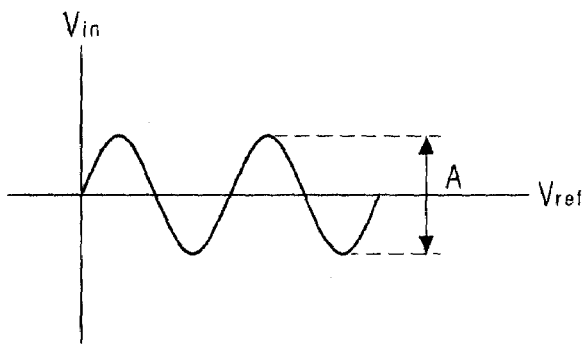
FIGS. 4A through 4F are views illustrating waveforms of signals appearing at respective points of the automatic gain controller as shown in FIG. 3.
Figure 4B:
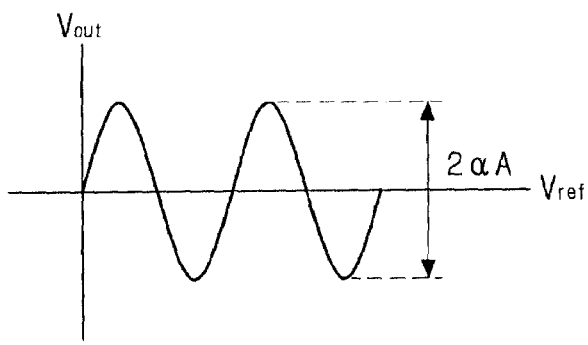
Figure 4C:
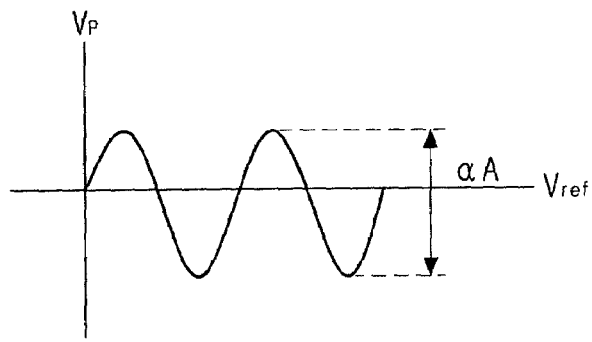
Figure 4D:
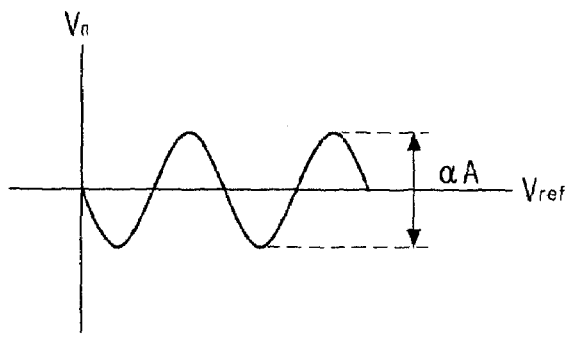
Figure 4E:
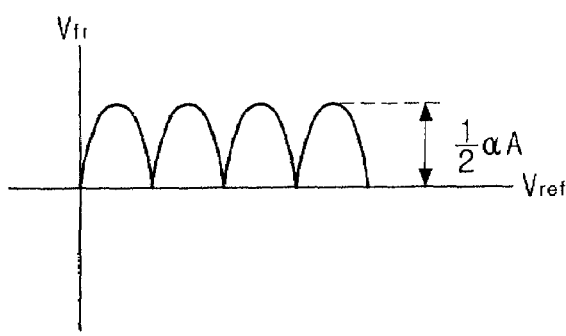
Figure 4F:
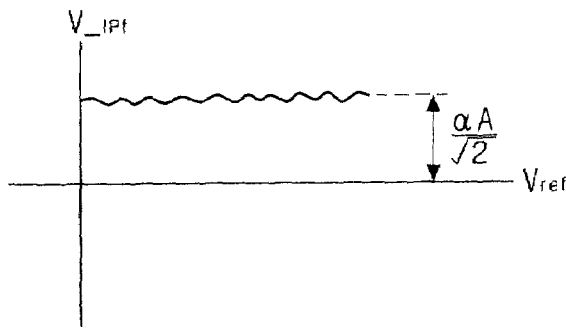
Figure 5:
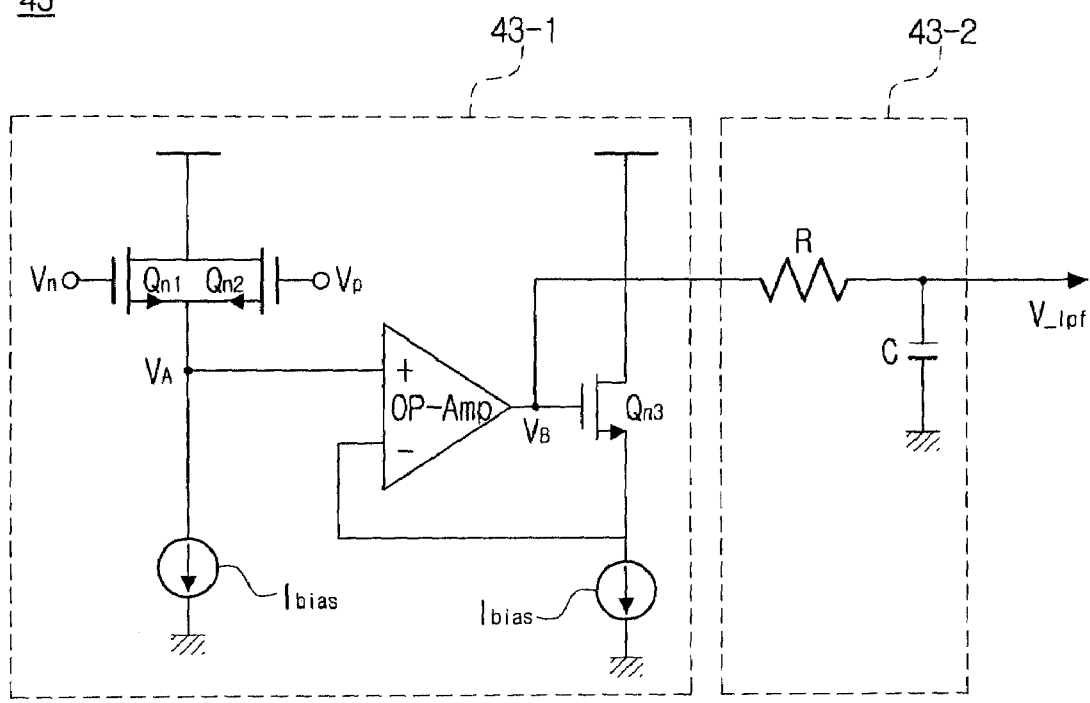
FIG. 5 is a view illustrating the detailed construction of the signal level detection unit of FIG. 3.
Figure 6A:
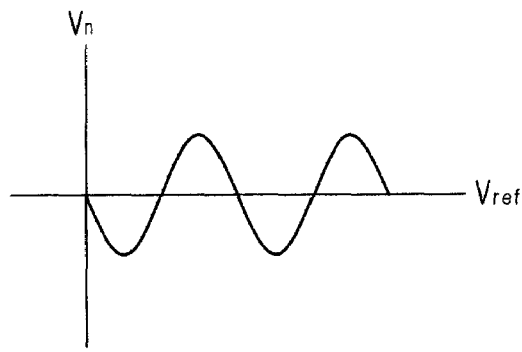
FIGS. 6A through 6E are views illustrating signal waveforms appearing at respective points of the signal level detection unit of FIG. 3.
Figure 6B:
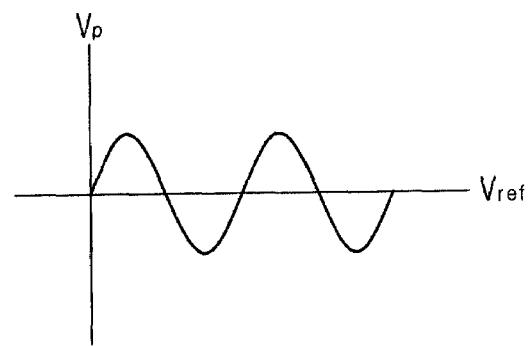
Figure 6C:
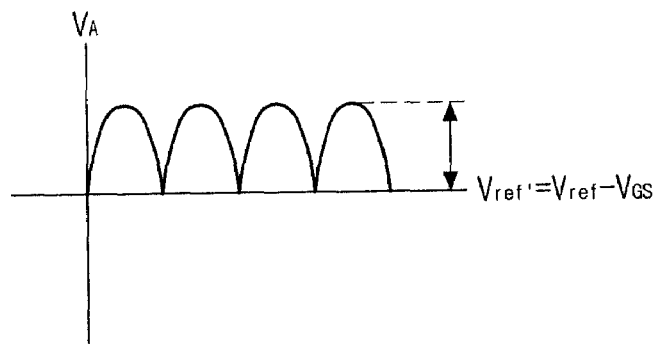
Figure 6D:
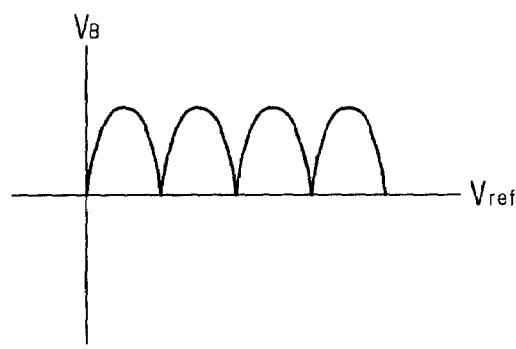
Figure 6E:
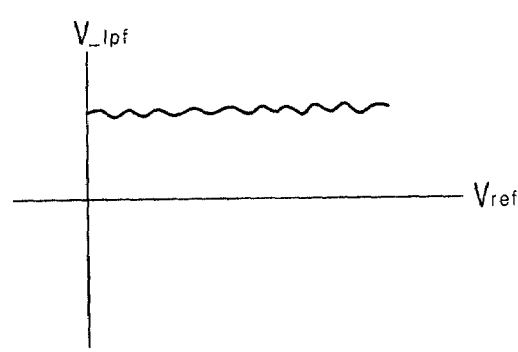

The low-pass filter 132 may be composed of a resistor R1 and a capacitor C1, and extracts a DC component from the signal Vc full-wave-rectified by the full-wave rectifier 131 to output the result to the comparison unit 140. The magnitude of the DC component of the full-wave-rectified signal Vc becomes a value obtained by adding the DC level Vref2 to a value which is obtained by adding an effective value of an AC component of the first differential signal Vp to an effective value of an AC component of the second differential signal Vn, as described with reference to FIGS. 3 and 4. Accordingly, supposing that the magnitude of the peak-to-peak voltage of the input signal Vin is A, the output voltage V_lpf of the low-pass filter 132 becomes $Vref2+(\alpha A/\sqrt{2})$.

If a reference voltage level adjustment unit 150 is input with a first reference voltage V_level, the reference voltage level adjustment unit 150 outputs a second reference voltage V_level' of which the DC level is lowered as much as $V_{GS}$ compared to the first reference voltage V_level. The reference voltage level adjustment unit 150 may be embodied by a third NMOS transistor $Q_{n3}$. The third NMOS transistor $Q_{n3}$ is driven by a bias current Ibias2 having the same magnitude as that of the bias current Ibias1 driving the first and second NMOS transistors $Q_{n1}$ and $Q_{n2}$. The first through third NMOS transistors $Q_{n1}$, $Q_{n2}$, and $Q_{n3}$ have identical operational characteristics.

If the first reference voltage V_level is applied to the gate of the third NMOS transistor $Q_{n3}$ the second reference voltage V_level' of which the DC level is lowered as much as $V_{GS}$ compared to the first reference voltage V_level is output from the source of the NMOS transistor $Q_{n3}$. That is, if the magnitude of the first reference voltage V_level applied to the gate of the third NMOS transistor $Q_{n3}$ is $Vref1+(Vpp/2\sqrt{2})$, the magnitude of the second reference voltage V_level' becomes $Vref2+(Vpp/2\sqrt{2})$. Herein, Vpp is the magnitude of a target peak-to-peak voltage of the output signal Vout, and $Vref2=Vref1-V_{GS}$.

The comparison unit 140 compares the output voltage V_lpf of the level detection unit 130 with the second reference voltage V_level', and increases the magnitude of the control voltage Vcontrol until the output voltage V_lpf reaches the second reference voltage V_level', thereby controlling the gain of the variable gain amplifier 110 to be constant.

More specifically, the comparison unit 140 may include a comparator 141, a switch SW, power sources $I_{sink}$ and $I_{source}$, and a capacitor C2.

The comparator 141 may be embodied by an operational amplifier having a positive input terminal and a negative input terminal. The reference voltage V_level' is applied to the positive input terminal from the source of the third NMOS transistor $Q_{n3}$, and the output voltage V_lpf' of the level detection unit 130 is applied to the negative input terminal.

If the second reference voltage V_level' is more than the output voltage V_lpf' of the level detection unit 130, the comparator 141 outputs a control signal Vup/down of a high level to switch the switch SW to the power source Isource, thereby increasing the control voltage Vcontrol. Accordingly, the gain of the variable gain amplifier 110 is increased, and thus the magnitude of the peak-to-peak voltage of the output signal Vout is increased. In contrast, if the second reference voltage V_level' is less than the output voltage V_lpf' of the level detection unit 130, the comparator 141 outputs a control signal Vup/down of a low level to switch the switch SW to the power source Isink, thereby lowering the control voltage Vcontrol. Accordingly, the gain of the variable gain amplifier 110 is decreased, and thus the magnitude of the peak-to-peak voltage of the output signal Vout is decreased.

The output voltage V_lpf' of the level detection unit 130 is $Vref2+(\alpha A/\sqrt{2})$, and the reference voltage V_level' is $Vref2+(Vpp/2\sqrt{2})$, so that the DC level is equal to Vref2. Accordingly, the comparison unit 140 compares an effective value $\alpha A/\sqrt{2}$ of the peak-to-peak voltage of the output voltage Vout with an effective value $Vpp/2\sqrt{2}$ of the target peak-to-peak voltage of the output signal Vout, and increases the magnitude of the control voltage Vcontrol until the effective value of the peak-to-peak voltage of the output signal Vout reaches the effective value of the target peak-to-peak voltage of the output signal Vout, thereby controlling the gain of the variable amplifier 110 to be constant.

Figure 9A:
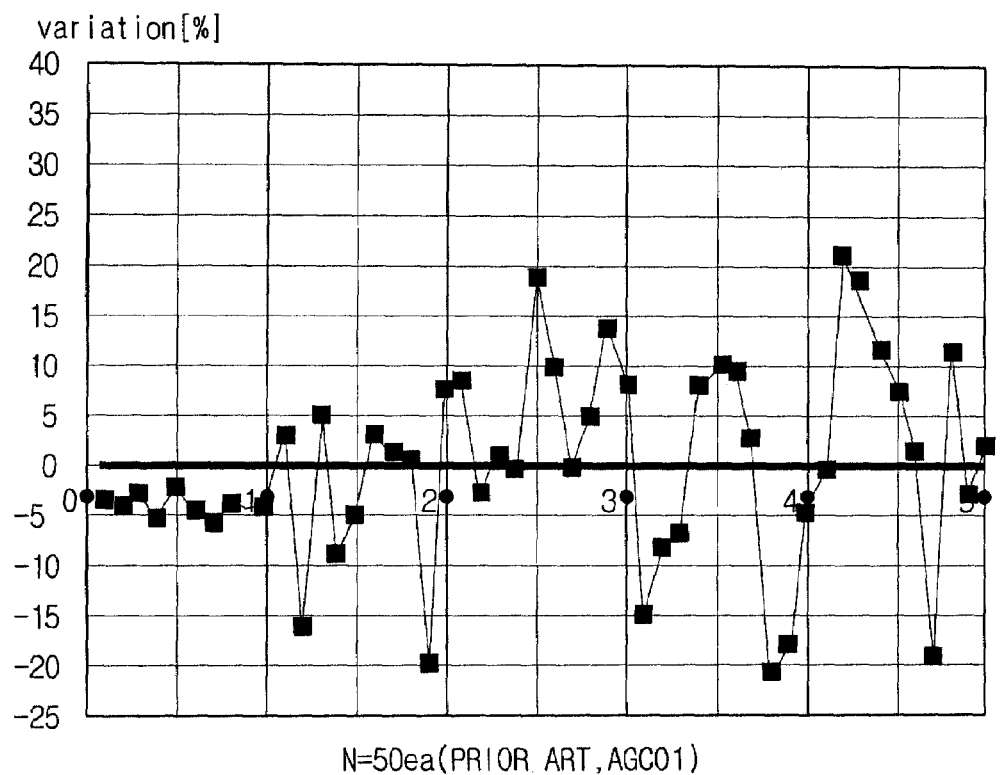
FIGS. 9A through 9D are views provided for comparison of variation among chips in which the conventional first and second automatic gain controllers are connected in parallel, with variation among chips in which first and second automatic gain controllers according to the present invention are connected in parallel.
Figure 9B:
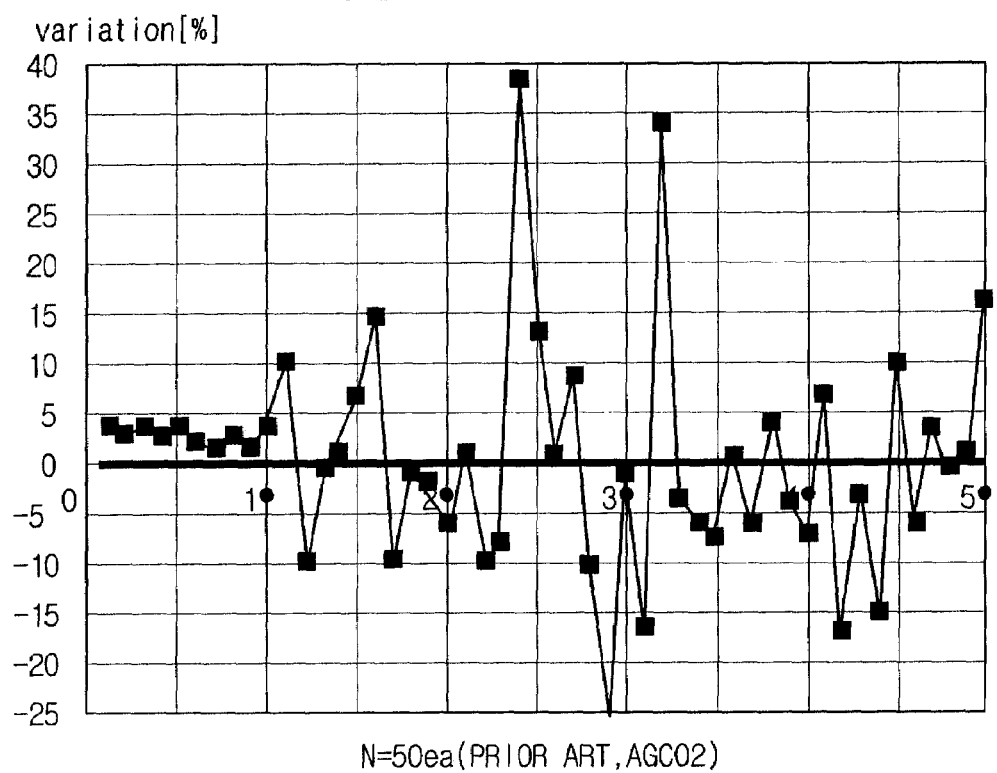

FIGS. 9A and 9B show variations of signals AGC01 and AGC02 outputted from a first automatic gain controller AGC1 and a second automatic gain controller AGC2, respectively, when an identical input signal Vin is applied to 50 chips manufactured according to the prior art in which the first automatic gain controller AGC1 and the second automatic gain controller AGC2 are connected to each other in parallel. It is to be noted from FIGS. 9A and 9B that a variation of signals between the conventional chips is in the range from −25% to 40%.

Figure 9C:
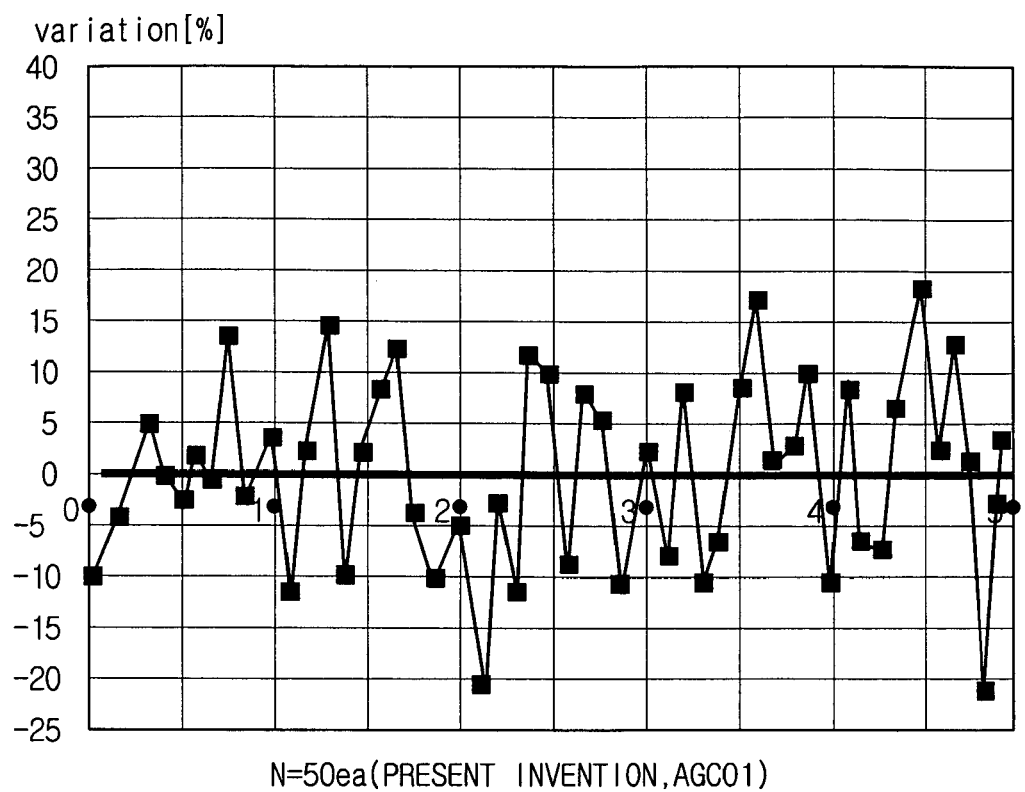
Figure 9D:
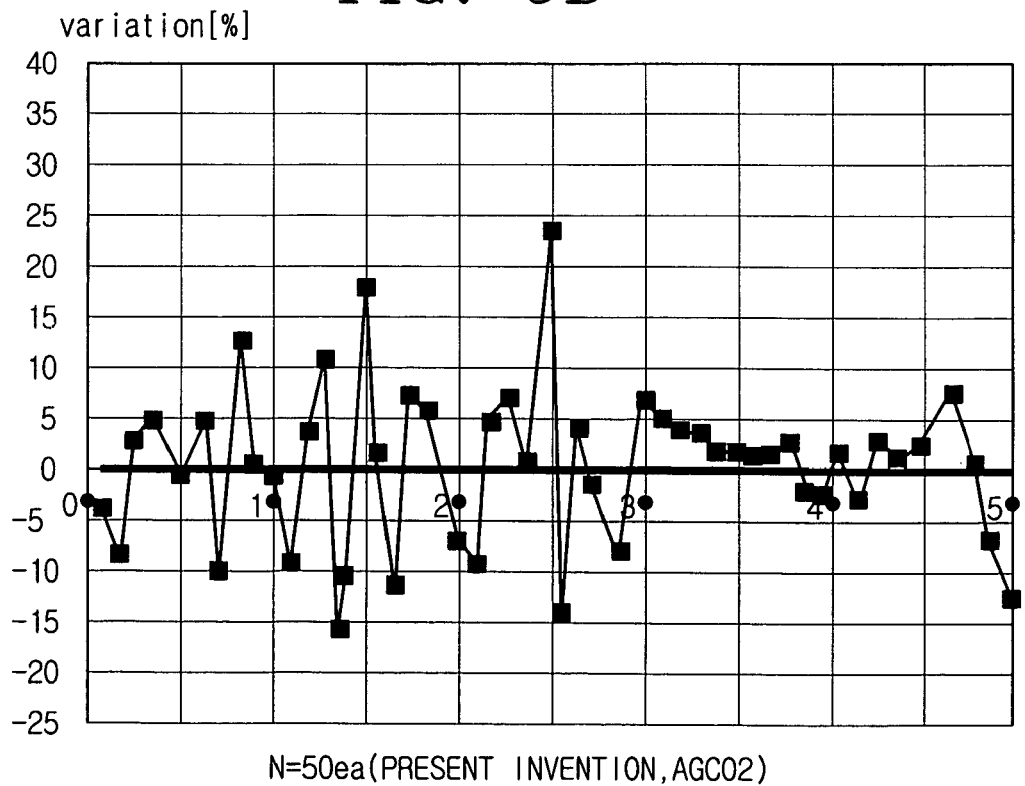

FIGS. 9C and 9D show variations of signals AGC01 and AGC02 outputted from a first automatic gain controller AGC1 and a second automatic gain controller AGC2, respectively, when an identical input signal Vin is applied to 50 chips manufactured according to the present invention in which the first automatic gain controller AGC1 and the second automatic gain controller AGC2 are connected to each other in parallel. It is to be noted from FIGS. 9C and 9D that a variation of signals between the chips of the present invention is in the range from −22% to 24%, which is remarkably improved in comparison with the prior art.

Figure 10A:
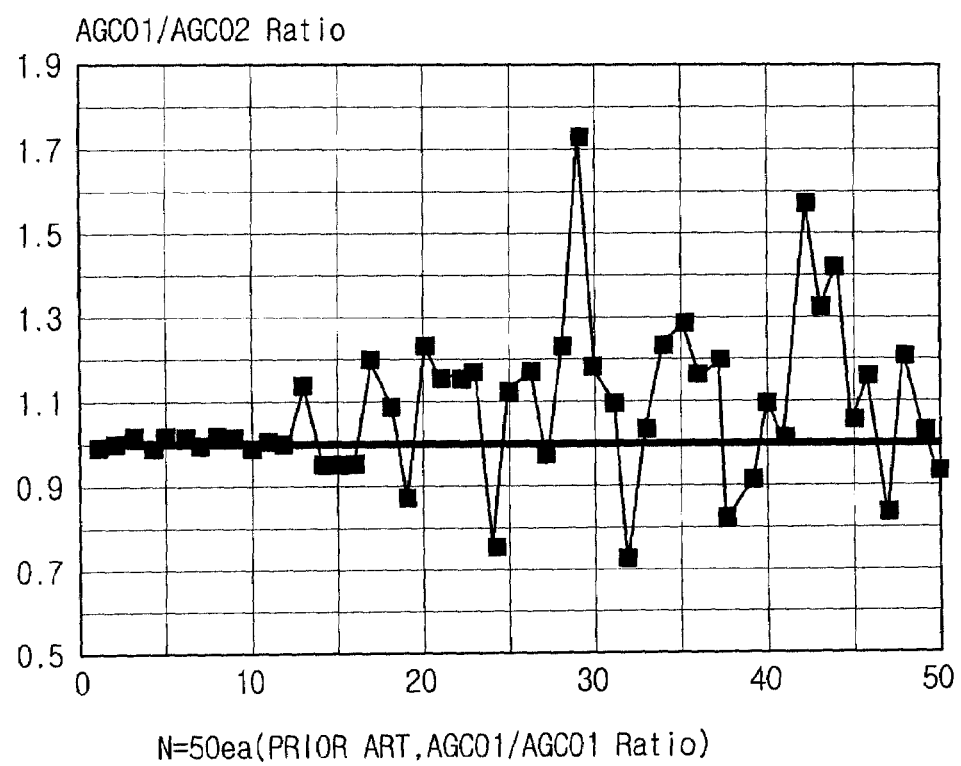
FIGS. 10A and 10B are views provided for comparison of the mismatching of the output signals of the conventional first and second automatic gain controllers connected in parallel, with the mismatching of the output signals of first and second automatic gain controllers according to the present invention connected in parallel.

FIG. 10A shows a ratio of the output signal of the first automatic gain controller AGC1 to the output signal of the second automatic gain controller AGC2, when an identical input signal Vin is applied to 50 chips manufactured according to the prior art in which the first automatic gain controller AGC1 and the second automatic gain controller AGC2 are connected to each other in parallel. It is to be noted from FIG. 10A that the ratio of the output signal AGC01 of the first automatic gain controller to the output signal AGC02 of the second automatic gain controller is in the range from 0.7 to 1.7.

Figure 10B:
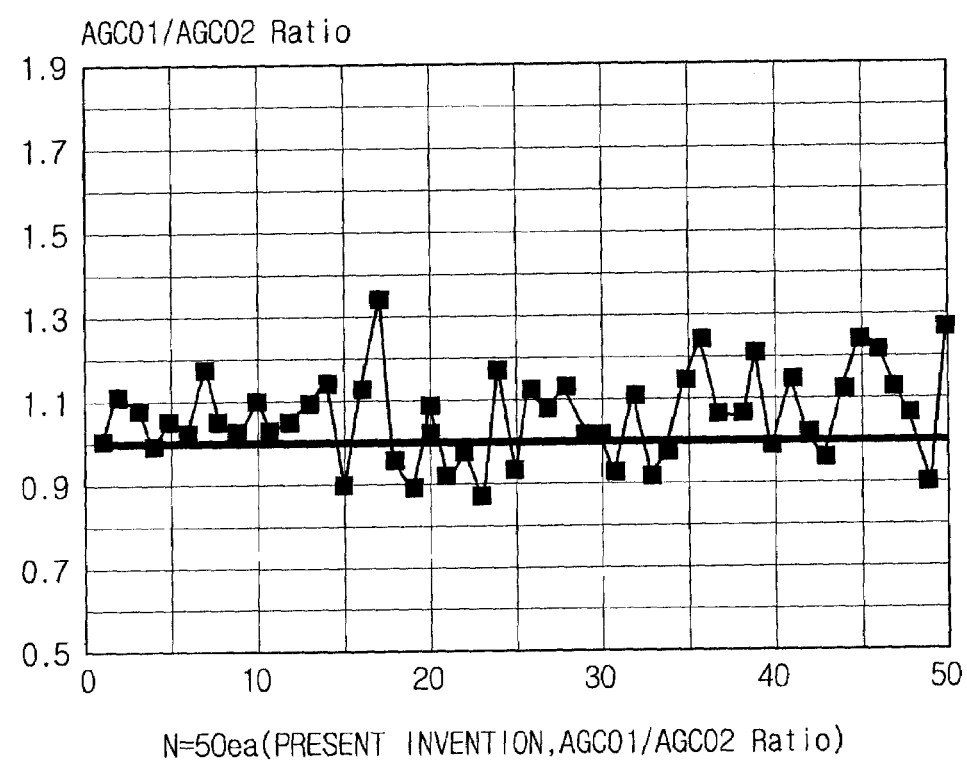

FIG. 10B shows a ratio of the output signal of the first automatic gain controller AGC1 to the output signal of the second automatic gain controller AGC2, when an identical input signal Vin is applied to 50 chips manufactured according to the present invention in which the first automatic gain controller AGC1 and the second automatic gain controller AGC2 are connected to each other in parallel. It is to be noted from FIG. 10B that the ratio of the output signal AGC01 of the first automatic gain controller to the output signal AGC02 of the second automatic gain controller is in the range from 0.9 to 1.35. That is, according to the present invention, mismatching between the output signal AGC01 of the first automatic gain controller and the output signal AGC02 of the second automatic gain controller is remarkably reduced.

As described above, according to the present invention, it is not required for an operational amplifier to shift the DC level to the reference voltage when the full-wave-rectifying unit full-wave-rectifies the first differential signal and the second differential signal. Therefore, the present invention may reduce a variation of signals outputted from different chips due to the offset present in the operational amplifier. Accordingly, there is an advantage of implementing the automatic gain controller with such high precision.

Also, since the operational amplifier is not used, an area of the chip can be reduced, relative to that of the prior art. Accordingly, there is another advantage of reducing power consumption.

The foregoing embodiment are merely exemplary in nature and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. An automatic gain controller comprising:
   a variable gain amplifier which amplifies an input signal having a specified direct current (DC) level, and outputs a first differential signal having a specified gain, a second differential signal having a 180° phase difference from the first differential signal, and a main output signal obtained by subtracting the second differential signal from the first differential signal;
   a full-wave-rectifying unit which receives and full-wave-rectifies the first differential signal and the second differential signal without using an operational amplifier;
   a low-pass filter which extracts DC component from an output signal of the full-wave-rectifying unit and outputs the extracted DC component;
   a reference voltage level adjustment unit which receives an input reference voltage and adjusts a DC level of the input reference voltage corresponding to a DC level produced when the first differential signal and the second differential signal are full-wave-rectified; and
   a comparison unit which compares an output signal of the low-pass filter with an output signal of the reference voltage level adjustment unit to adjust the specified gain of the variable gain amplifier.

2. The automatic gain controller as claimed in claim 1, wherein if the output signal of the low-pass filter is higher than the output signal of the reference voltage level adjustment unit, the comparison unit decreases the specified gain of the variable gain amplifier, and if the output signal of the low-pass filter is lower than the output signal of the reference voltage level adjustment unit, the comparison unit increases the specified gain of the variable gain amplifier.

3. The automatic gain controller as claimed in claim 1, wherein the output signal of the reference voltage level adjustment unit has a magnitude obtained by adding an effective value of a target peak-to-peak voltage of the main output signal to the DC level produced when the first differential signal and the second differential signal are being full-wave-rectified.

4. The automatic gain controller as claimed in claim 1, wherein the full-wave-rectifying unit comprises:
- a first transistor which half-wave-rectifies the first differential signal received through its gate, and outputs the half-wave-rectified first differential signal to its source; and
- a second transistor which half-wave-rectifies the second differential signal received through its gate, and outputs the half-wave-rectified second differential signal to its source;
- wherein a connection point of the source of the first transistor and the source of the second transistor is connected to an input terminal of the low-pass filter.

5. The automatic gain controller as claimed in claim 4, wherein the reference voltage level adjustment unit comprises a third transistor which lowers the DC level of the input reference voltage received through its gate as much as the variation of the DC level, and outputs an output reference voltage with the DC level lowered to its source.

6. The automatic gain controller as claimed in claim 4, wherein the first through third transistors are N-type metal-oxide semiconductor (NMOS) transistors.

7. The automatic gain controller as claimed in claim 5, wherein the first through third transistors have the same characteristic, and are driven by a bias current having the same magnitude.

8. The automatic gain controller as claimed in claim 1, further comprising a high-pass filter which level-shifts the first and second differential signals outputted from the variable gain amplifier so that the first and second differential signals have a same DC level, and outputs the signals to the full-wave-rectifying unit.

* * * * *